United States Patent
Yatsenko et al.

(10) Patent No.: US 9,742,451 B2
(45) Date of Patent: Aug. 22, 2017

(54) MULTIPLEXER DEVICE WITH HYBRID LC/ACOUSTIC FILTER

(71) Applicant: Avago Technologies General IP (Singapore) Pte. Ltd., Singapore (SG)

(72) Inventors: Andriy Yatsenko, Munich (DE); Hongya Xu, Munich (DE); Lueder Elbrecht, Munich (DE); Martin Handtmann, Riemerling (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/673,136

(22) Filed: Mar. 30, 2015

(65) Prior Publication Data

US 2016/0294423 A1 Oct. 6, 2016

(51) Int. Cl.
*H04B 1/10* (2006.01)
*H03H 7/46* (2006.01)
*H03H 9/60* (2006.01)
*H03H 9/64* (2006.01)
*H03H 9/70* (2006.01)
*H03H 9/72* (2006.01)
*H03H 9/00* (2006.01)

(52) U.S. Cl.
CPC .......... *H04B 1/1036* (2013.01); *H03H 7/463* (2013.01); *H03H 9/605* (2013.01); *H03H 9/6483* (2013.01); *H03H 9/706* (2013.01); *H03H 9/725* (2013.01); *H03H 9/0004* (2013.01)

(58) Field of Classification Search
CPC combination set(s) only.
See application file for complete search history.

(56) References Cited

U.S. PATENT DOCUMENTS

| 7,583,936 | B2 | 9/2009 | Kovacs et al. | |
| 2004/0209590 | A1* | 10/2004 | Forrester | H04B 1/406 455/324 |
| 2004/0248614 | A1 | 12/2004 | Ella | |
| 2007/0190954 | A1* | 8/2007 | Murakami | H03H 7/38 455/132 |
| 2008/0042778 | A1* | 2/2008 | Jamneala | H03H 9/0004 333/133 |
| 2014/0113580 | A1* | 4/2014 | Yamazaki | H03H 9/6483 455/307 |
| 2016/0119017 | A1* | 4/2016 | Xu | H04B 1/48 455/79 |

OTHER PUBLICATIONS

Steve Beaudin et al., "A New SAW Band Reject Filter and its Applications in Wireless Systems," 2002 IEEE Ultrasonics Symposium, pp. 147-151.

* cited by examiner

*Primary Examiner* — Junpeng Chen

(57) ABSTRACT

A multiplexer device includes at least one acoustic band pass filter connected to a common port, and a hybrid LC/acoustic filter connected to the common port in parallel with the at least one acoustic band pass filter. Each acoustic band pass filter has a corresponding passband and includes multiple acoustic resonators. The hybrid LC/acoustic filter includes at least one acoustic resonator, and has at least one capacitor replaced by a corresponding at least one acoustic resonator, respectively. Each of the at least one acoustic resonator included in the hybrid LC/acoustic filter provides a stopband response when operating in a corresponding acoustic frequency range, and acts as a capacitor when operating in a corresponding non-acoustic frequency range.

20 Claims, 5 Drawing Sheets

MULTIPLEXER DEVICE WITH HYBRID LC/ACOUSTIC FILTER

BACKGROUND

Portable communication devices, such as cellular telephones, portable computers, personal digital assistants (PDAs), Global Navigation Satellite System (GNSS) (e.g., including global positioning system (GPS)) receivers, and the like, are configured to communicate over wireless networks. Such portable communication devices may enable communication over multiple networks, and therefore include transmitters, receivers and corresponding filters in multiplexer devices, connecting the receivers and transmitters to a common antenna, for sending and receiving signals (e.g., radio frequency (RF) signals) over the various networks.

A multiplexer device interfaces between the antenna and each of the networks to enable transmitting signals on different transmit (uplink) frequencies and receiving signals on different receive (downlink) frequencies. The filters associated with the multiplexer device include band pass filters and band stop filters (or notch filters). Generally, the band pass filters provide passbands for passing various transmitted and received signals through relatively narrow frequency bands (blocking all signals with frequencies outside the passbands), while the notch filters provide stopbands for blocking various transmitted and received signals in relatively narrow frequency bands (passing all signals with frequencies outside the stopbands). The band pass filters and notch filters may be used in a complementary fashion, such that a band pass filter associated with a first network has a passband that corresponds to (e.g., matches) a stopband of a notch filter associated with a second network. In this manner, the likelihood of the signals passing through the band pass filter interfering with the signals of the second network is greatly reduced.

FIG. 1A is a block diagram showing an example of a conventional multiplexer device providing band pass and notch filters for different networks, as well as an inductor-capacitor (LC) diplexer consisting of high pass and low pass filters. FIG. 1B is a graph showing a typical notch filter transmission response (insertion loss) of the conventional multiplexer device having only acoustic notch filters.

In FIG. 1A, multiplexer device 100 is arranged in a cascading topology. That is, a common antenna port 105 is connected in parallel between first band pass filter 111 and corresponding first notch filter (or band stop filter) 112 in a first notch filter path 110. The antenna port 105 is connected to an antenna 108 for receiving and/or transmitting signals, such as RF signals, corresponding to various types of networks. The output of the first notch filter 112 is connected in series between second band pass filter 121 and corresponding second notch filter 122 in a second notch filter path 120. This series connection adds additional losses to both notch filter 122 and band pass filter 121. Each of the first band pass filter 111, the first notch filter 112, the second band pass filter 121 and the second notch filter 122 is an acoustic filter, such as a ladder-type acoustic band pass filter, formed of multiple series and shunt connected acoustic resonators.

Since a typical acoustic notch filter, such as first and second notch filters 112 and 122, does not provide sufficient rejection in corresponding non-acoustic areas, additional filtering is required. For example, FIG. 1B is a graph showing insertion loss (in decibels (dB)) versus frequency (in gigahertz (GHz)) of a WiFi acoustic notch filter. As shown by trace 140 in FIG. 1B, a representative acoustic notch filter provides a stopband 144 between about 2.4 GHz and about 2.5 GHz. Notably, the acoustic notch filter provides practically no attenuation (apart from the stopband) over the entire depicted frequency range of 0.5 GHz to 3.0 GHz, in which most wireless applications operate.

Thus, in order to make the wireless system more efficient (for example, using different front-end modules for low and high cell bands), the acoustic notch filter can be separated into two or more narrower frequency ranges. In FIG. 1A, for example, LC diplexer 130 is connected in series to the second notch filter 122. The LC diplexer 130 separates the second notch filter path 120 into a low pass filter (LPF) 131 and a high pass filter (HPF) 132. Thus, the LPF 131 filters out the higher frequencies, while the HPF 132 filters out the lower frequencies, as well as frequency ranges corresponding to the stopbands of the first and second notch filters 112 and 122. As mentioned above, in the conventional multiplexer device 100, each of the LPF 131 and the HPF 132 is an LC filter. Generally, an LC filter is formed of inductor(s) and capacitor(s), although some resistance incidental to circuit design and implementation may also appear in an LC filter. In the context of the multiplexer devices discussed herein, including multiplexer devices 100, 200 and 300, an LC filter includes inductor(s) and capacitor(s) as elements in the filter architecture, but no acoustic resonators.

The topology of the conventional multiplexer device 100 has a number of drawbacks. For example, the insertion loss of the second band pass filter 121 is higher than that of the first band pass filter 111 due to the cascading topology. The insertion loss of second notch filter path 120 is even more impacted, as compared to the insertion loss of the first notch filter path 110, by the additional LC diplexer 130 connected in series. The LC diplexer 130 architecture also requires additional area for the second notch filter path 120.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
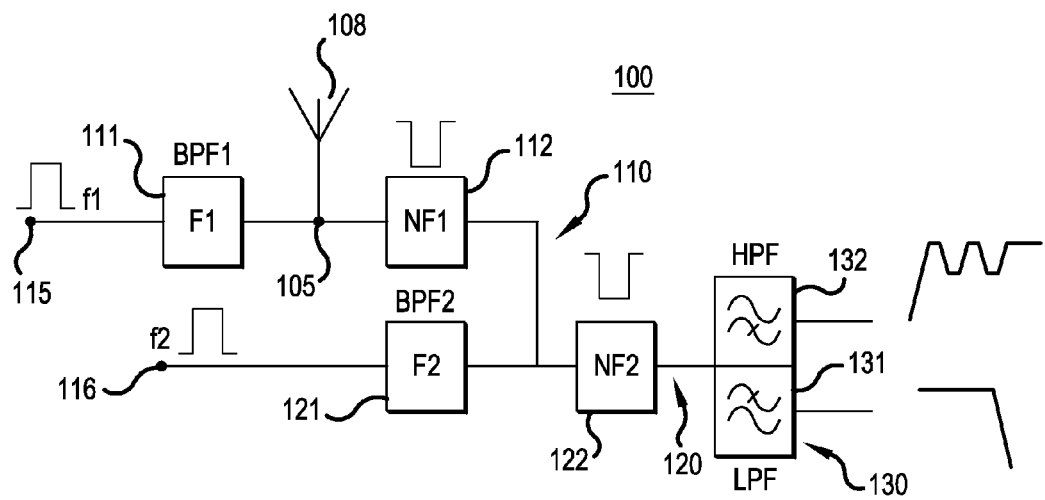
FIG. 1A is a simplified block diagram of a conventional multiplexer device including acoustic filters and an LC diplexer.
Figure 1B:
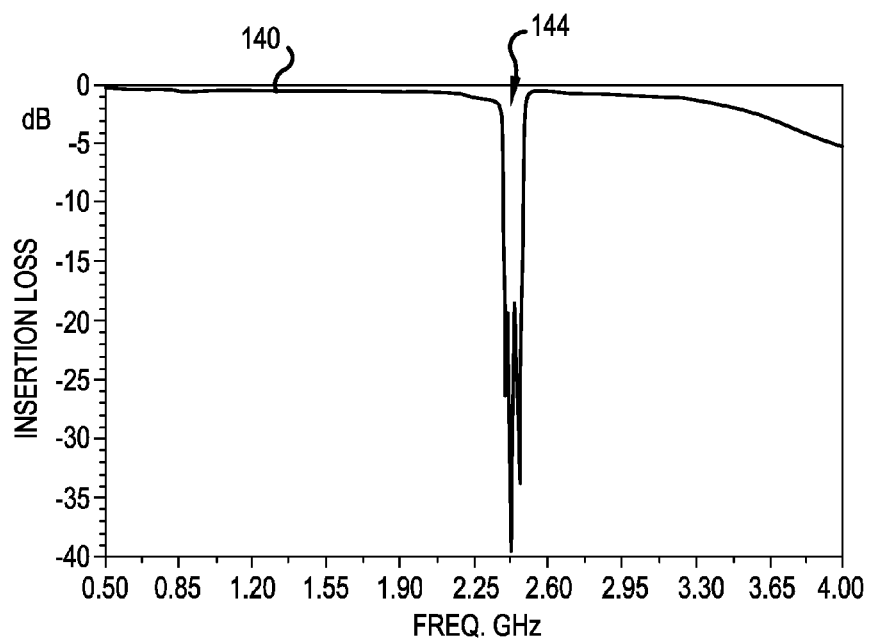
FIG. 1B is a graph showing notch filter transmission response (insertion loss) as a function of signal frequency for a conventional multiplexer device having only acoustic notch filters.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Generally, according to various embodiments, a multiplexer device is provided for selecting a network among various available networks to access a common antenna for at least one of transmitting and receiving signals (e.g., RF signals). The multiplexer device implements acoustic notch filters (or band stop filters) as hybrid LC/acoustic filter(s), in which one or more capacitors (up to all of the capacitors) of what would otherwise be an LC filter have been replaced by acoustic resonators, respectively. The hybrid LC/acoustic filter(s) may include at least one notch filter that provides attenuation in acoustic and non-acoustic frequency ranges with the lowest possible insertion loss and occupied area. The hybrid LC/acoustic filter(s) may provide low pass, high pass or band pass functionality to meet application specific design requirements of various implementations, as would be apparent to one skilled in the art. The hybrid LC/acoustic filter(s) connect together in parallel with the other filters of the multiplexer device, e.g., including acoustic band pass filters and LC filter(s) directly to a common port, such as a common antenna port connected to an antenna.

Thus, according to a representative embodiment, a multiplexer device includes at least one acoustic band pass filter connected to a common port, each acoustic band pass filter having a corresponding passband and comprising multiple acoustic resonators (e.g., arranged in a ladder-type configuration). The multiplexer device further includes a hybrid LC/acoustic filter, including at least one acoustic resonator, connected to the common port in parallel with the at least one acoustic band pass filter. In particular, the hybrid LC/acoustic filter has at least one capacitor replaced by a corresponding at least one acoustic resonator, respectively. Each of the at least one acoustic resonator included in the hybrid LC filter/acoustic provides a stopband response when operating in a corresponding acoustic frequency range (or domain), and acts as a capacitor when operating in a corresponding non-acoustic frequency range (or domain).

Figure 2:
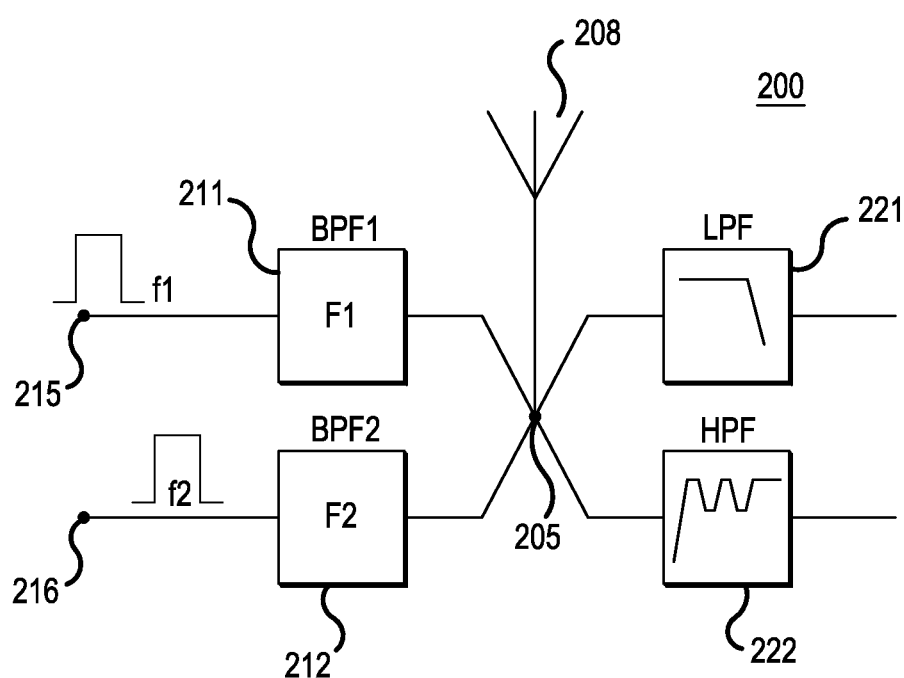
FIG. 2 is a simplified block diagram of a multiplexer device including acoustic filters and a hybrid LC/acoustic filter, according to a representative embodiment.

FIG. 2 is a simplified block diagram of a multiplexer device including acoustic filters and a hybrid LC/acoustic filter, according to a representative embodiment.

Referring to FIG. 2, multiplexer device 200 is a quadplexer, for purposes of illustration, although embodiments are not limited thereto. The multiplexer device 200 includes a common antenna port 205 connected to antenna 208 for receiving and/or transmitting signals, such as RF signals corresponding to various networks and/or types of networks. The multiplexer device 200 further includes multiple band pass filters, indicated by representative first band pass filter 211 and second band pass filter 212 connected in parallel with one another to the antenna port 205. The number of parallel connected band pass filters and corresponding networks and/or types of networks may be more than two, without departing from the scope of the present teachings. That is, the multiplexer device 200 may include up to n band bass filters connected in parallel, where n is a positive integer greater than two.

The first and second band pass filters 211 and 212 have different passbands at corresponding operating frequencies. As shown in FIG. 2, the first band pass filter 211 has a first passband at operating frequency f1, and the second band pass filter 212 has a second passband at operating frequency f2. Accordingly, the first and second band pass filters 211 and 212 block (filter out) frequencies outside the respective first and second passbands. In various embodiments, the first and second band pass filters 211 and 212 are acoustic filters comprising acoustic resonators, such as bulk acoustic wave (BAW) resonators or surface acoustic wave (SAW) resonators. The BAW resonators may include thin film bulk acoustic resonators (FBARs) and/or solidly mounted resonators (SMRs), for example. Also, the first and second band pass filters 211 and 212 may be ladder-type filters, for example, including series and shunt connected acoustic resonators, discussed below with reference to FIG. 3.

As mentioned above, the first and second band pass filters 211 and 212 may be connected to different networks via corresponding network nodes, respectively, for filtering RF signals transmitted (uplinked) and/or received (downlinked) through the network. Therefore, the first band pass filter 211 is connected to a first network node 215 for communicating with a first network, and the second band pass filter 212 is connected to a second network node 216 for communicating with a second network. For example, the first network may be WiFi network (IEEE 802.11) and the second network may be a Global Navigation Satellite System (GNSS) network, such as a Global Positioning System (GPS) network, although additional and/or other types of networks may be included without departing from the scope of the present teachings. For example, the first network may be a Bluetooth network (IEEE 802.15.1), and/or the second network may be a Galileo communication system network, a BeiDou-2 communication system network or a GLONASS network, for example, although the various embodiments are not limited thereto.

The multiplexer device 200 also includes representative LC filter 221 and hybrid LC/acoustic filter 222, which are connected to the common antenna port 205 in parallel with one another and in parallel with the first and second band pass filters 211 and 212. In the depicted embodiment, the LC filter 221 is a low pass filter and is formed of inductors and capacitors, and no acoustic resonators, as discussed above. The hybrid LC/acoustic filter 222 is a high pass filter and is essentially an LC filter in which at least one capacitor is replaced by an acoustic resonator. In the present example, the low pass LC filter 221 provides frequency separation into low band frequency range (e.g., 700-960 MHz), while the high pass hybrid LC/acoustic filter 222 with high pass frequency characteristics provides further separation into high band frequency range (e.g., 1710-2690 MHz). A low band front-end module (with acoustic filters) may be connected to the low pass filter path, and one or many front-end modules (through the switch) may be connected to the high pass hybrid LC/acoustic filter path. However, in general, the LC filter 221 may be used in the cases where no high-rejection and sharp filter steepness is required (otherwise, high-Q filters would be needed). In other words, the LC filter 221 is configured to provide insertion loss and attenuation, when there is no need for high-Q acoustic resonator filters. For example, for a 5 GHz WiFi filter, the passband is about 4900-5925 MHz (depending on the country or region), and currently there are no rejection requirements within 2000 MHz from the passband.

In an embodiment, all of the capacitors have been replaced by acoustic resonators within the hybrid LC/acoustic filter 222, although fewer than all of the capacitors may be replaced by acoustic resonators without departing from the scope of the present teachings. The acoustic resonators in the hybrid LC/acoustic filter 222 may be BAW resonators (e.g., FBARs and/or SMRs) or SAW resonators, for example.

The low pass LC filter 221 is configured to cover low frequency cell bands and the high pass hybrid LC/acoustic filter 222 is configured to cover various higher frequency cell bands, for example, starting from about 1710 MHz to about 2690 MHz. Also, the hybrid LC/acoustic filter 222 has two stopbands (or rejection bands) that correspond to the passbands of the first and second band pass filters 211 and 212, respectively. For example, the stopbands of the hybrid LC/acoustic filter 222 may correspond to a WiFi frequency band (e.g., about 2.4 GHz to about 2.5 GHz) and a GPS frequency band (e.g., about 1.575 GHz or about 1.228 GHz), respectively.

Instead of capacitors connected in series, as known for conventional high pass LC filter topologies, high-Q acoustic resonators are used in the hybrid LC/acoustic filter 222. Each of these acoustic resonators provides a stopband in a corresponding active acoustic frequency range, and has a capacitive character in a corresponding non-acoustic frequency range (away from its active acoustic region), which is used for achieving attenuation in the non-acoustic frequency range. That is, the capacitive character of each of the acoustic resonators, combined with inductors, provides attenuation in the non-acoustic frequency range. In the active acoustic region, the acoustic resonators (e.g., FBARs) are optimized for creating a high-Q band stop filter (having one or more stopbands).

Alternative embodiments may include a multiplexer device with more than two band pass filters (e.g., in addition to first and second band pass filters 211 and 212) having different corresponding passbands. In this case, additional stopbands corresponding to the additional passbands are included in the multiplexer device. For example, in various embodiments, all of the two or more stopbands may be included in a single hybrid LC/acoustic filter (such as hybrid LC/acoustic filter 222), or the stopbands may be included in multiple hybrid LC/acoustic filters, where each hybrid LC filter/acoustic includes one or more stopbands. Also, in various embodiments, one or more stopbands may be included in one or more LC filters (such as LC filter 221).

Figure 3:
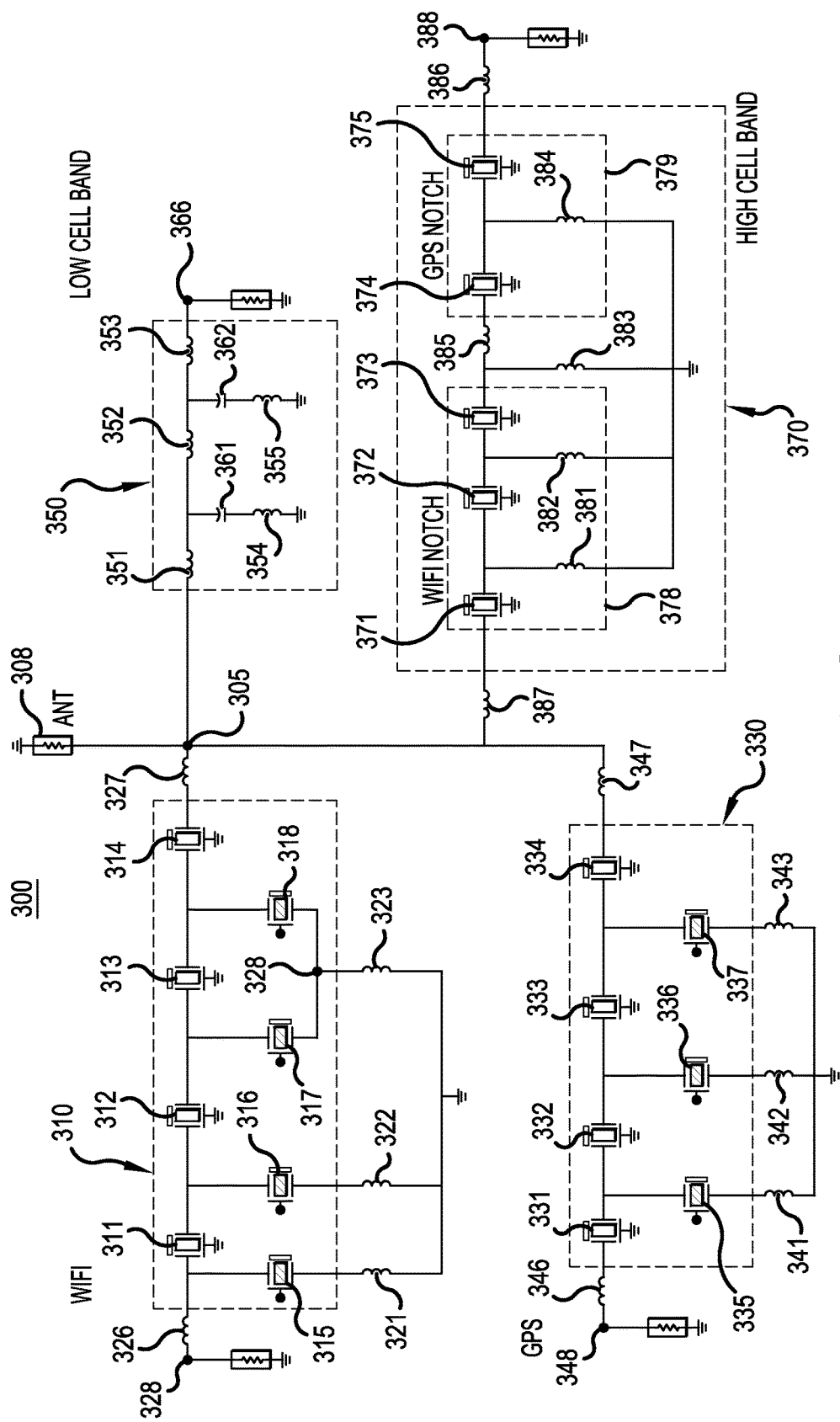
FIG. 3 is a simplified circuit diagram of a multiplexer device including acoustic filters and a hybrid LC filter/acoustic, according to a representative embodiment.

FIG. 3 is a simplified circuit diagram of a multiplexer device including acoustic filters and a hybrid LC/acoustic filter, according to a representative embodiment.

Referring to FIG. 3, a multiplexer device 300 is a quadplexer, for purposes of illustration, although embodiments are not limited thereto. The multiplexer device 300 includes a common antenna port 305 connected to antenna 308 for receiving and/or transmitting signals, such as RF signals corresponding to various networks and/or types of networks. The multiplexer device 300 further includes representative first band pass filter 310 and second band pass filter 330 connected in parallel with one another to the antenna port 305, as well as representative LC filter 350 and hybrid LC/acoustic filter 370, which are connected to the common antenna port 305 in parallel with one another and in parallel with the first and second band pass filters 310 and 330. In the depicted embodiment, the LC filter 350 is a low pass filter and the hybrid LC/acoustic filter 370 is a high pass filter with stopbands corresponding to first and second passbands of the first and second band pass filters 310 and 330, respectively.

In the depicted embodiment, the first band pass filter 310 is a ladder-type acoustic filter comprising series and shunt connected acoustic resonators, such as BAW or SAW resonators. More particularly, the first band pass filter 310 includes series acoustic resonators 311, 312, 313 and 314 and shunt acoustic resonators 315, 316, 317 and 318. The shunt acoustic resonator 315 is connected between first network node 328 and the series acoustic resonator 311. The shunt acoustic resonator 316 is connected between the series acoustic resonators 311 and 312. The shunt acoustic resonator 317 is connected between the series acoustic resonators 312 and 313. The shunt acoustic resonator 318 is connected between the series acoustic resonators 313 and 314. The shunt acoustic resonators 315 and 316 are also connected to ground via shunt inductors 321 and 322, respectively, while the shunt acoustic resonators 317 and 318 are connected together at node 329, which is connected to ground via shunt inductor 323. A series inductor 326 is connected between the series acoustic resonator 311 and the first network node 328, and a series inductor 327 is connected between the series acoustic resonator 314 and the antenna port 305.

The second band pass filter 330 is also a ladder-type acoustic filter comprising series and shunt connected acoustic resonators, such as BAW or SAW resonators. More particularly, the second band pass filter 330 includes series acoustic resonators 331, 332, 333 and 334 and shunt acoustic resonators 335, 336 and 337. The shunt acoustic resonator 335 is connected between the series acoustic resonators 331 and 332. The shunt acoustic resonator 336 is connected between the series acoustic resonators 332 and 333. The shunt acoustic resonator 337 is connected between the series acoustic resonators 333 and 334. The shunt acoustic resonators 335, 336 and 337 are also connected to ground via shunt inductors 341, 342 and 343, respectively. A series inductor 346 is connected between the series acoustic resonator 331 and the second network node 348, and a series inductor 347 is connected between the series acoustic resonator 334 and the antenna port 305.

Although the shunt inductors 321-323 and the series inductors 326-327 of the first band pass filter 310, and the shunt inductors 341-343 and the series inductors 346-347 of the second band pass filter 330, are depicted as actual inductor components, it is understood that one or more of these shunt and series inductors may be implemented, in whole or in part, as line inductances. Of course, various arrangements of acoustic resonators, inductors and/or other circuit components may vary, to provide unique benefits for particular situations or to meet application specific design requirements of various implementations of the multiplexer device 300, as would be apparent to one skilled in the art.

Also, for purposes of illustration, the first network to which the first band pass filter 310 is connected via the first network node 328 is a WiFi network, and the second network to which the second band pass filter 330 is connected via the second network node 348 is a GPS network, although other types of networks may be incorporated without departing from the scope of the present teachings. Each of the first and second network nodes 328 and 348 may be connected to a switch or coupler configured to transfer RF signals from a transmitter (not shown) to the antenna port 305 via a power amplifier and/or to transfer RF signals to a receiver (not shown) from the antenna port 305, for example.

As mentioned above, the first and second band pass filters 310 and 330 have different passbands at corresponding operating frequencies in their respective networks. In addition, the number of parallel connected band pass filters and corresponding networks and/or types of networks may be more than two, without departing from the scope of the present teachings.

Referring again to FIG. 3, the LC filter 350 includes only inductors and capacitors (and no acoustic resonators), and thus is typical of an LC filter. More particularly, the LC filter 350 includes series inductors 351, 352 and 353 connected between the antenna port 305 and third network node 366. The LC filter 350 further includes shunt inductors 354 and 355 and shunt capacitors 361 and 362. The shunt capacitor 361 is connected between the series inductors 351 and 352, and the shunt capacitor 362 is connected between the series inductors 352 and 353. Also, the shunt capacitor 361 is connected to ground via the shunt inductor 354 connected in series, and the shunt capacitor 362 is connected to ground via the series connected shunt inductor 355 connected in series.

For purposes of illustration, the third network to which the LC filter 350 is connected via the third network node 366 is a low cell band network, such as 3GPP or Long-Term Evolution (LTE) band 5 (uplink frequency band of 824 MHz-849 MHz and downlink frequency band of 869 MHz-894 MHz), band 8 (uplink frequency band of 880 MHz-915 MHz and downlink frequency band of 925 MHz-960 MHz), or band 20 (uplink frequency band of 832 MHz-862 MHz and downlink frequency band of 791 MHz-821 MHz), for example, although other types of networks may be incorporated without departing from the scope of the present teachings. As mentioned above, the LC filter 350 is a low pass filter, configured to block or filter out frequencies higher than the filter cutoff frequency, including the operating frequencies of the first and second networks. Alternatively, the LC filter 350 may be replaced by a high pass LC filter or a band pass LC filter in other configurations to provide unique benefits for particular situations or to meet application specific design requirements of various implementations of the multiplexer device 300, as would be apparent to one skilled in the art.

The hybrid LC/acoustic filter 370 includes inductors and acoustic resonators, where the acoustic resonators replace capacitors in what would otherwise be in an LC filter. In the depicted embodiment, all of the capacitors have been replaced by acoustic resonators, although fewer than all of the capacitors may be replaced without departing from the scope of the present teachings. More particularly, the hybrid LC/acoustic filter 370 includes high-Q series acoustic resonators 371, 372, 373, 374 and 375 connected between the antenna port 305 and fourth network node 388. The series acoustic resonators 371, 372, 373, 374 and 375 may be FBARs, for example, although other types of acoustic resonators may be incorporated without departing from the scope of the present teachings. The hybrid LC/acoustic filter 370 further includes shunt inductors 381, 382, 383 and 384. The shunt inductor 381 is connected between the series acoustic resonators 371 and 372. The shunt inductor 382 is connected between the series acoustic resonators 372 and 373. The shunt inductor 383 is connected between the series acoustic resonators 373 and 374. The shunt inductor 384 is connected between the series acoustic resonators 374 and 375. Each of the shunt inductors 381, 382, 383 and 384 is also connected to ground.

The hybrid LC/acoustic filter 370 also includes a series inductor 385 connected in series between the series acoustic resonators 373 and 374. In addition, a series inductor 386 is connected between the series acoustic resonator 375 and the fourth network node 388, and a series inductor 387 is connected between the series acoustic resonator 371 and the antenna port 305.

For purposes of illustration, the fourth network to which the hybrid LC/acoustic filter 370 is connected via the fourth network node 388 is a high cell band network, such as 3GPP or LTE band 1 (uplink frequency band of 1.920 GHz-1.980 GHz and downlink frequency band of 2.110 GHz-2.170 GHz), band 3 (uplink frequency band of 1.710 GHz-1.785 GHz and downlink frequency band of 1.805 GHz-1.880 GHz), or band 7 (uplink frequency band of 2.500 GHz-2.570 GHz and downlink frequency band of 2.620 GHz-2.690 GHz), for example, although other types of networks may be incorporated without departing from the scope of the present teachings. As mentioned above, the hybrid LC/acoustic filter 370 is a high pass filter, configured to block or filter out frequencies lower than the filter cutoff frequency. The hybrid LC/acoustic filter 370 is further configured to block frequencies corresponding to the passbands of the first and second band pass filters 310 and 330 in respective stopbands. Alternatively, the hybrid LC/acoustic filter 370 may be replaced by a low pass hybrid LC/acoustic filter or a band pass hybrid LC/acoustic filter (an example of which is discussed below with reference to FIGS. 5A and 5B) in other configurations to provide unique benefits for particular situations or to meet application specific design requirements of various implementations of the multiplexer device 300.

The hybrid LC/acoustic filter 370 may be virtually separated into two band stop or notch filters corresponding to the first and second band pass filters 310 and 330, respectively. That is, a first band stop filter circuit 378 of the hybrid LC/acoustic filter 370 includes the series acoustic resonators 371, 372 and 373 and the shunt inductors 381, 382 and 383, while a second band stop filter circuit 379 of the hybrid LC/acoustic filter 370 includes the series acoustic resonators 374 and 375 and the shunt inductor 384. The series acoustic resonators 371, 372 and 373 of the first band stop filter circuit 378 are designed to provide a first stopband that corresponds to the first passband of the first band pass filter 310 (e.g., the frequency range of the WiFi network). The series acoustic resonators 374 and 375 of the second band stop filter circuit 379 are designed to provide a second stopband that corresponds to the second passband of the second band pass filter 330 (e.g., the frequency range of the GPS network). In other words, the series acoustic resonators 371, 372, 373, 374 and 375 are optimized in their active acoustic regions to create high-Q band stop filters (first and second band stop filter circuits 378 and 379), respectively. Each of the series acoustic resonators 371, 372, 373, 374 and 375 has a capacitive character away from its corresponding active acoustic region, thereby providing attenuation in the non-acoustic frequency ranges.

Notably, because the first band stop filter circuit 378 and the first band pass filter 310 operate at similar frequency ranges, the first band stop filter circuit 378 and the first band pass filter 310 may be integrated into one physical layout. Likewise, because the second band stop filter circuit 379 and the second band pass filter 330 operate at similar frequency ranges, the second band stop filter circuit 379 and the second band pass filter 330 may be integrated into another physical layout. This approach provides improved performance and smaller laminate packages, while the number of acoustic resonator (e.g., FBAR) dies can be kept at a minimum.

Figure 4A:
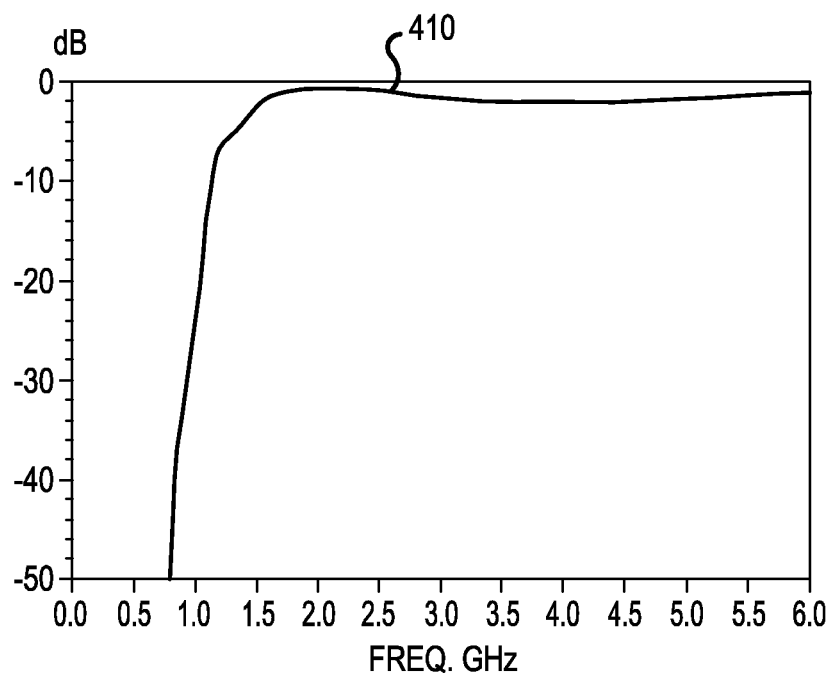
FIG. 4A is a graph showing frequency response of a conventional high pass LC filter.
Figure 4B:
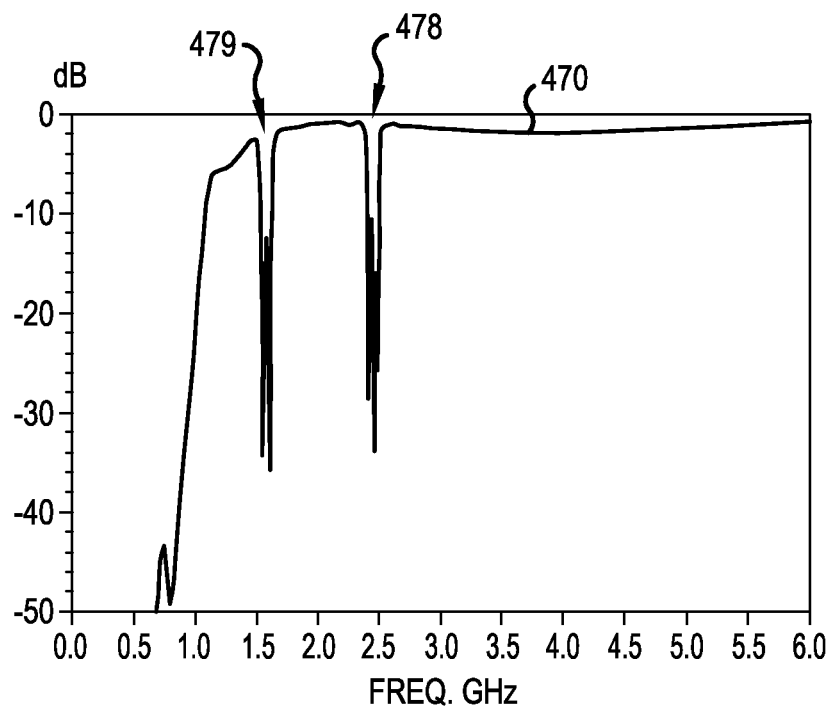
FIG. 4B is a graph showing frequency response of a high pass hybrid LC/acoustic filter included in the multiplexer device of FIG. 3, according to a representative embodiment.

FIG. 4A is a graph showing frequency response of a conventional high pass LC filter (for purposes of comparison), and FIG. 4B is a graph showing an illustrative frequency response of a high pass hybrid LC/acoustic filter, such as the hybrid LC/acoustic filter 370 included in the multiplexer device 300, according to a representative embodiment.

Referring to FIG. 4A, trace 410 corresponds to the output of a conventional high pass LC filter. As shown, the LC filter has a cutoff frequency of about 0.8 GHz. At higher frequencies (e.g., from about 1.5 GHz), the LC filter outputs a signal at about −2.0 dB. Referring to FIG. 4B, trace 470 corresponds to an illustrative output of the hybrid LC/acoustic filter 370 depicted in FIG. 3. Similar to trace 410 in FIG. 4A, hybrid LC/acoustic filter has a cutoff frequency of about 0.8 GHz. Also, at higher frequencies (e.g., from about 1.5 GHz), the hybrid LC/acoustic filter generally outputs a signal at about −2.0 dB, with the exception of first and second stopbands 478 and 479, e.g., corresponding to the first and second band stop filter circuits 378 and 379 of the hybrid LC/acoustic filter 370. That is, the second stopband 479 occurs between about 1.5 GHz and about 1.6 GHz (corresponding to GPS network frequency), and the first stopband 478 occurs between about 2.4 GHz and about 2.5 GHz (corresponding to WiFi frequency band).

Figure 5A:
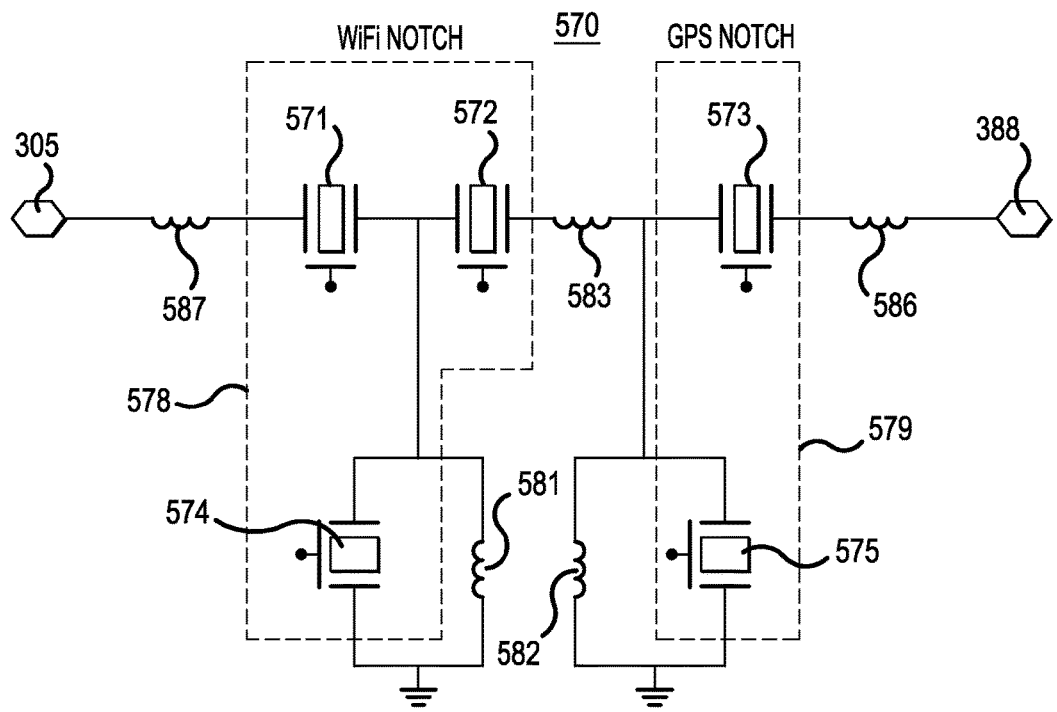
FIG. 5A is a simplified circuit diagram of a band pass hybrid LC/acoustic filter in a multiplexer device, according to a representative embodiment.
Figure 5B:
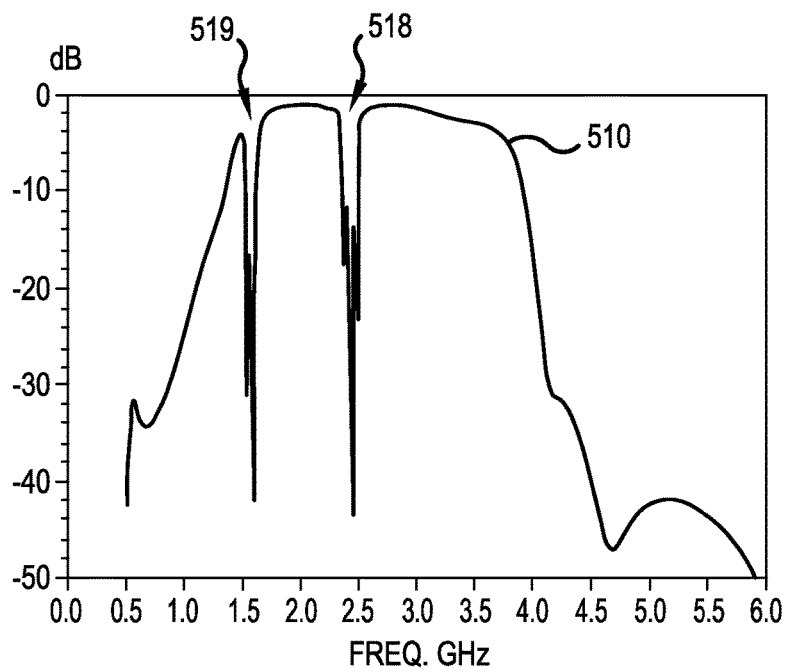
FIG. 5B is a graph showing frequency response of a band pass hybrid LC/acoustic filter included in a multiplexer device, according to a representative embodiment.

As mentioned above, a hybrid LC/acoustic filter may be a band pass filter or a low pass filter, as opposed to a high pass filter, such as the high pass hybrid LC/acoustic filter 370, discussed above with reference to FIG. 3. FIG. 5A is a simplified circuit diagram of a band pass hybrid LC/acoustic filter in a multiplexer device, and FIG. 5B is a graph showing an illustrative frequency response of the band pass hybrid LC/acoustic filter in FIG. 5A, according to a representative embodiment.

Referring to FIG. 5A, hybrid LC/acoustic filter 570 is an example of a band pass hybrid LC/acoustic filter, and may be used in place of the high pass hybrid LC/acoustic filter 370 in the multiplexer device 300, for example. The hybrid LC/acoustic filter 570 includes inductors and acoustic resonators, where the acoustic resonators replace capacitors in what would otherwise be in an LC filter. In the depicted embodiment, all of the capacitors have been replaced by acoustic resonators, although fewer than all of the capacitors may be replaced without departing from the scope of the present teachings.

More particularly, the hybrid LC/acoustic filter 570 includes high-Q series acoustic resonators 571, 572 and 573 connected between the antenna port 305 and the fourth network node 388. The hybrid LC/acoustic filter 570 further includes high-Q shunt acoustic resonator 574 connected between series acoustic resonators 571 and 572, and high-Q shunt acoustic resonator 575 connected between series acoustic resonators 572 and 573. The series acoustic resonators 571, 572 and 573 and the shunt acoustic resonators 574 and 575 may be FBARs, for example, although other types of acoustic resonators may be incorporated without departing from the scope of the present teachings. The hybrid LC/acoustic filter 570 further includes shunt inductors 581 and 582 connected in parallel with shunt acoustic resonators 574 and 575, respectively. Each of the shunt acoustic resonators 574 and 575 and the shunt inductors 381 and 382 is also connected to ground.

The hybrid LC/acoustic filter 570 also includes a series inductor 583 connected in series between the series acoustic resonators 572 and 573, such that, more precisely, the shunt acoustic resonator 575 (and the shunt inductor 582) is connected between series inductor 583 and the series acoustic resonator 573. In addition, a series inductor 586 is connected between the series acoustic resonator 373 and the fourth network node 388, and a series inductor 587 is connected between the series acoustic resonator 571 and the antenna port 305.

As discussed above with reference to the high pass hybrid LC/acoustic filter 370, the band pass hybrid LC/acoustic filter 570 may be virtually separated into two band stop or notch filters corresponding to the first and second band pass filters 310 and 330, respectively. That is, a first band stop filter circuit 578 of the hybrid LC/acoustic filter 570 includes the series acoustic resonators 571 and 572, the shunt acoustic resonator 574, and the shunt inductor 581, while a second band stop filter circuit 579 of the hybrid LC/acoustic filter 570 includes the series acoustic resonator 573, the shunt acoustic resonator 575, and the shunt inductor 582. The series acoustic resonators 571 and 572, and the shunt acoustic resonator 574 of the first band stop filter circuit 578 are designed to provide a first stopband that corresponds to the first passband of the first band pass filter 310 (e.g., the frequency range of the WiFi network). The series acoustic resonator 573 and the shunt acoustic resonator 575 of the second notch filter circuit 579 are designed to provide a second stopband that corresponds to the second passband of the second band pass filter 330 (e.g., the frequency range of the GPS network). In other words, the series and shunt acoustic resonators 571, 572, 573, 574 and 575 are optimized in their active acoustic regions to create high-Q band stop filters (first and second band stop filter circuits 578 and 579), respectively. Each of the series and shunt acoustic resonators 571, 572, 573, 574 and 575 has a capacitive character away from its corresponding active acoustic region, thereby providing attenuation in the non-acoustic frequency ranges.

Referring to FIG. 5B, trace 510 corresponds to an illustrative output of the hybrid LC/acoustic filter 570 depicted in FIG. 5A. Because it is a band pass filter, the hybrid LC/acoustic filter 570 has low and high filter cutoff frequencies, where in the depicted example, the low cutoff frequency is about 0.5 GHz and the high cutoff frequency is about 4.0 GHz. Between the low and high cutoff frequencies (e.g., from about 1.5 GHz to about 3.5 GHz), the hybrid LC/acoustic filter 570 generally outputs a signal at about −2.0 dB, with the exception of first and second stopbands 518 and 519, e.g., corresponding to the first and second band stop filter circuits 578 and 579 of the hybrid LC/acoustic filter 570. That is, the second stopband 519 occurs between about 1.5 GHz and about 1.6 GHz (corresponding to GPS network frequency), and the first stopband 518 occurs between about 2.4 GHz and about 2.5 GHz (corresponding to WiFi frequency band).

The various components, structures and parameters are included by way of illustration and example only and not in any limiting sense. For example, although depicted representative embodiments show one LC filter and one hybrid LC/acoustic filter, it is understood that alternative configurations may include multiple LC filters and/or multiple hybrid LC/acoustic filters connected in parallel, to provide unique benefits for particular situations or to meet application specific design requirements of various implementations, without departing from the scope of the present teachings. In view of this disclosure, those skilled in the art can implement the present teachings in determining their own applications and needed components, materials, structures and equipment to implement these applications, while remaining within the scope of the appended claims.

The invention claimed is:

1. A multiplexer device, comprising:
first acoustic band pass filter connected between a first network node and a common antenna port, the first acoustic band pass filter having a first passband and comprising a plurality of first acoustic resonators;
a second acoustic band pass filter connected between a second network node and the common antenna port, the second acoustic band pass filter having a second passband and comprising a plurality of second acoustic resonators; and
a hybrid LC/acoustic filter connected between a third network node and the common antenna port, the hybrid LC/acoustic filter including a first set of acoustic resonators comprising at least one first acoustic resonator configured to provide a first stopband corresponding to the first passband, and a second set of acoustic resonators comprising at least one second acoustic resonator configured to provide a second stopband corresponding to the second passband, the hybrid LC/acoustic filter comprising an LC filter circuit having at least one capacitor replaced by each of the at least one first acoustic resonator and the at least one second acoustic resonator, respectively,
wherein the hybrid LC/acoustic filter has a predetermined frequency range for passing radio frequency (RF) signals, except for frequencies corresponding to the first and second stopbands, which are entirely within the predetermined frequency range for passing the RF signals.

2. The device of claim 1, wherein all capacitors of the LC filter are replaced by acoustic resonators, respectively, to provide the hybrid LC/acoustic filter.

3. The device of claim 1, wherein each of the first and second acoustic band pass filters is a ladder-type acoustic band pass filter.

4. The device of claim 1, further comprising:
at least one LC filter connected between a fourth network node and the common antenna port, the LC filter having inductors and capacitors, and no acoustic resonators.

5. The device of claim 4, wherein the LC filter is configured to provide insertion loss and attenuation, when there is no need for high-Q acoustic resonator filters.

6. The device of claim 4, wherein the hybrid LC/acoustic filter comprises a low pass filter such that the predetermined frequency range of the hybrid LC/acoustic filter has an end frequency higher than both the first and second passbands, and the LC filter comprises one of a band pass filter or a high pass filter.

7. The device of claim 4, wherein the hybrid LC/acoustic filter comprises a high pass filter such that the predetermined frequency range of the hybrid LC/acoustic filter has a start frequency lower than both the first and second passbands, and the LC filter comprises one of a band pass filter or a low pass filter.

8. The device of claim 4, wherein the hybrid LC/acoustic filter comprises a band pass filter such that the predetermined frequency range of the hybrid LC/acoustic filter has a start frequency lower than both the first and second passbands and an end frequency higher than both the first and second passbands, and the LC filter comprises one of a band pass filter, a low pass filter or a high pass filter.

9. The device of claim 1, wherein each of the first and second sets of acoustic resonators included in the hybrid LC/acoustic filter comprises a bulk acoustic wave (BAW) resonator.

10. The multiplexer device of claim 1, wherein each of the first and second sets of acoustic resonators included in the hybrid LC/acoustic filter comprises a surface acoustic wave (SAW) resonator.

11. The device of claim 1, wherein the first and second sets of acoustic resonators included in the hybrid LC/acoustic filter provide the first and second stopbands when operating in corresponding active acoustic frequency ranges, respectively, and each of the at least one first acoustic resonator and the at least one second acoustic resonator acts as a capacitor when operating in corresponding non-acoustic frequency ranges.

12. A communication device, comprising:
an antenna port;
a plurality of filter paths;
a plurality of network nodes for accessing corresponding communications networks, the plurality of network nodes being associated with different communication bandwidths, respectively; and
a plurality of filter elements corresponding to the plurality of filter paths, the plurality of filter elements being connected between the antenna port and the plurality of network nodes, respectively, wherein the plurality of filter elements comprise:
at least one high-Q band pass filter with a corresponding passband having a passband frequency range, each of the at least one high-Q band pass filter comprising high-Q acoustic resonators; and
at least one high-Q band stop filter with at least one corresponding stopband having a stopband frequency range substantially the same as the passband frequency range of the at least one high-Q band pass filter, respectively, each of the at least one high-Q band stop filter comprising at least one high-Q acoustic resonator with a corresponding active acoustic region,
wherein the at least one high-Q acoustic resonator of each of the at least one high-Q band stop filter has a capacitive character, causing the at least one high-Q band stop filter to function as a band stop filter having no high-Q acoustic resonators when operating away from the corresponding active acoustic region.

13. The communication device of claim 12, wherein, when operating away from the corresponding active acoustic region, the at least one high-Q band stop filter provides an insertion loss in the filter path including the at least one high-Q band stop filter substantially the same as an insertion loss of the at least one high-Q band pass filter.

14. The communication device of claim 12, wherein the at least one corresponding stopband of each of the at least one high-Q band stop filter provides high-rejection and sharp filter steepness, enabling multiple corresponding stopbands in the at least one high-Q band stop filter.

15. The communication device of claim 12, wherein, when operating away from the corresponding active acoustic region, the at least one high-Q acoustic resonator of each of the at least one high-Q band stop filter is configured to provide an insertion loss in the filter paths.

16. The communication device of claim 12, wherein at least one high-Q band pass filter comprises a first band pass filter with a first passband frequency range, and a second band pass filter with a second passband frequency range different from the first passband frequency range, and
    wherein the at least one high-Q band stop filter comprises a first band stop filter and a second band stop filter coupled in series with the first band stop filter, the first band stop filter having a first stopband frequency range substantially matching the first passband frequency range, and the second band stop filter having a second stopband frequency range substantially matching the second passband frequency range.

17. The communication device of claim 16, wherein the first band pass filter and the first band stop filter are integrated into one physical layout.

18. A communication device, comprising:
    an antenna port;
    a plurality of filter paths;
    a plurality of network nodes for accessing corresponding communications networks, the plurality of network nodes being associated with different communication bandwidths, respectively; and
    a plurality of filter elements corresponding to the plurality of filter paths, the plurality of filter elements being connected between the antenna port and the plurality of network nodes, respectively, wherein the plurality of filter elements comprise:
        at least one band pass filter with a corresponding passband having a passband frequency range, each of the at least one band pass filter comprising acoustic resonators; and
        at least one band stop filter with at least one corresponding stopband having a stopband frequency range substantially the same as the passband frequency range of the at least one band pass filter, respectively, each of the at least one band stop filter comprising at least one acoustic resonator with a corresponding acoustic frequency range,
    wherein the at least one acoustic resonator of each of the at least one band stop filter has a high-Q character when operating in the corresponding acoustic frequency range, and has a capacitive character when operating in a non-acoustic frequency range, and
    wherein the at least one band stop filter functions as an inductor-capacitor (LC) band pass filter when the at least one acoustic resonator has the capacitive character.

19. The communication device of claim 18, wherein the at least one acoustic resonator of each of the at least one band stop filter provides an insertion loss in each of the filter paths when operating in the non-acoustic frequency range.

20. A radio frequency (RF) filter device connected between a network node and an antenna port, the RF filter device comprising:
    at least one inductor; and
    at least one high-Q acoustic resonator connected to the at least one inductor, the at least one high-Q acoustic resonator having a corresponding active acoustic region,
    wherein the RF filter device provides at least one high-Q stopband created by the at least one high-Q acoustic resonator operating in the corresponding active acoustic region, the at least one high-Q stopband corresponding to a pass band of a band pass filter connected between another network node and the antenna port, and
    wherein the at least one high-Q acoustic resonator has a capacitive character when operating away from the corresponding active acoustic region, such that the RF filter device functions as an LC filter when the at least one high-Q acoustic resonator operates away from the corresponding active acoustic region.

* * * * *